United States Patent
Simin et al.

(10) Patent No.: US 9,467,105 B2
(45) Date of Patent: Oct. 11, 2016

(54) PERFORATED CHANNEL FIELD EFFECT TRANSISTOR

(71) Applicant: Sensor Electronic Technology, Inc., Columbia, SC (US)

(72) Inventors: Grigory Simin, Columbia, SC (US); Mikhail Gaevski, West Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 176 days.

(21) Appl. No.: 14/225,761

(22) Filed: Mar. 26, 2014

(65) Prior Publication Data

US 2014/0291740 A1  Oct. 2, 2014

Related U.S. Application Data (60) Provisional application No. 61/805,397, filed on Mar. 26, 2013.

(51) Int. Cl.
| | |
|---|---|
| *H01L 29/10* | (2006.01) |
| *H01L 29/66* | (2006.01) |
| *H01L 29/78* | (2006.01) |
| *H03F 3/217* | (2006.01) |
| *H01L 29/40* | (2006.01) |
| *H01L 29/778* | (2006.01) |
| *H01L 29/06* | (2006.01) |
| *H01L 29/20* | (2006.01) |

(52) U.S. Cl.
CPC ......... *H03F 3/2171* (2013.01); *H01L 29/0603* (2013.01); *H01L 29/1029* (2013.01); *H01L 29/2003* (2013.01); *H01L 29/402* (2013.01); *H01L 29/404* (2013.01); *H01L 29/66462* (2013.01); *H01L 29/7787* (2013.01); *H03F 3/2176* (2013.01)

(58) Field of Classification Search
CPC ........... H01L 29/0603; H01L 29/1041; H01L 29/1054
See application file for complete search history.

(56) References Cited

U.S. PATENT DOCUMENTS

| | | | |
|---|---|---|---|
| 2005/0110053 A1* | 5/2005 | Shur | G01N 27/414 257/253 |
| 2014/0231823 A1* | 8/2014 | Chowdhury | H01L 21/283 257/76 |

OTHER PUBLICATIONS

Wu et al., "30-W/mm GaN HEMTs by Field Plate Optimization", IEEE EDL, V. 25, 2004, p. 117-119.
Simin et al., "Stable 20 W/mm AlGaN—GaN MOSHFET", Electronics Letters vol. 41, No. 13, 2005, p. 774-775.
Ando et al., "10-W/mm AlGaN—GaN HFET With a Field Modulating Plate", IEEE EDL, V. 24, 2003, p. 289-291.
(Continued)

*Primary Examiner* — Raj R Gupta
(74) *Attorney, Agent, or Firm* — LaBatt, LLC (57) ABSTRACT

A device including a plurality of perforations to a semiconductor channel is provided. The device includes a semiconductor structure forming the semiconductor channel. Additionally, the device includes a source contact, a drain contact, and a gate contact to the semiconductor channel. The plurality of perforations can be located in the semiconductor structure below the gate contact. Furthermore, a perforation in the plurality of perforations can extend into the semiconductor structure beyond a location of the semiconductor channel.

20 Claims, 8 Drawing Sheets (56) References Cited

OTHER PUBLICATIONS

Sokal et al., "Class E—A New Class of High-Efficiency Tuned Single-Ended Switching Power Amplifiers," IEEE Journal of Solid-State Circuits, vol. SC-10, No. 3, Jun. 1975, pp. 168-176.
Raab, "Idealized Operation of the Class E Tuned Power Amplifier," IEEE Transactions on Circuits and Systems, vol. CAS-24, No. 12, Dec. 1997, pp. 725-735.
Saito et al., "Demonstration of 13.56-MHz Class-E Amplifier Using a High-Voltage GaN Power-HEMT", IEEE El. Dev. Lett., V. 27, 2006, p. 326-328.
Wu et al., "A 97.8% Efficient GaN HEMT Boost Converter With 300-W Output Power at 1 MHz", IEEE El. Dev. Lett., V. 29, 2008, p. 824-826.
Pribble et al., "A high efficiency Class-E amplifier utilizing GaN HEMT technology", Abstract from the 2006 IEEE Topical Workshop on PAs for Wireless Communications (RWS), http://www.cree.com/products/Wireless_docs.htm.
Grebennikov, "High-Efficiency Class E/F Lumped and Transmission-Line Power Amplifiers", IEEE, MTT-59, 2011, p. 1579-1588.
Saito et al., "Design Optimization of High Breakdown Voltage AlGaN—GaN Power HEMT on an Insulating Substrate for RONA-VB Tradeoff Characteristics", IEEE Trans. El. Dev. V. 52, 2005, p. 106-111.
Koudymov et al., "Low-loss High Power RF Switching using Multigate AlGaN/GaN MOS Heterostructure Field-Effect Transistors", IEEE El. Dev. Lett. , V. 23 N8, 2002, p. 449-451.

* cited by examiner

PERFORATED CHANNEL FIELD EFFECT TRANSISTOR

REFERENCE TO RELATED APPLICATIONS

The current application claims the benefit of U.S. Provisional Application No. 61/805,397, titled "Perforated Channel Power GaN MISHFET For High-Efficiency Power Amplifiers," which was filed on 26 Mar. 2013, and which is hereby incorporated by reference.

TECHNICAL FIELD

The disclosure relates generally to field effect transistors, and more particularly, to a field effect transistor having a perforated channel.

BACKGROUND ART

Gallium nitride (GaN) based heterostructure field effect transistors (HFETs) have a huge potential for power switches and radio frequency (RF) power amplifiers due to record high operating voltages, peak drain currents, high cut-off frequencies, high operating temperature and robustness. For example, such devices have achieved more than an order of magnitude lower loss in power converters and RF power densities in the range of ten to thirty Watts per millimeter (W/mm), which exceed those achieved with silicon (Si) or gallium arsenide (GaAs) based technologies by a factor of ten to one hundred.

Factors limiting the performance of power GaN HFETs and all other types of field-effect transistors (FETs) include a finite value of the device resistance in the on-state and input/output capacitances in the off-state. A low on-resistance, $R_{ON}$, and low input and output capacitances, $C_{IN}$ and $C_{OUT}$, respectively, are important characteristics of transistor power switches and power amplifiers. In most FET types, such as high electron mobility transistors (HEMTs), (HFETs), metal-semiconductor FETs (MESFETs), metal oxide semiconductor FETs (MOSFETs), etc., the $R_{ON}$ value can be decreased by increasing the total gate width, $W_G$. However, a larger total gate width leads to a higher gate capacitance, $C_G$, and gate charge, $Q_G$, which increases the switching loss. As a result, a $R_{ON}C_G$ product provides a figure of merit of a FET-type switch, characterizing the overall power losses. In conventional FETs, the $R_{ON}C_{IN}$ and $R_{ON}C_{OUT}$ products only can be traded off against the operating voltage, since decreasing $R_{ON}$ by shortening the gate-drain distance reduces the maximum device operating voltage.

SUMMARY OF THE INVENTION

An embodiment provides a novel design of a FET, with $R_{ON}C_{IN}$ and $R_{ON}C_{OUT}$ products below the theoretical limits for conventional FETs. Further aspects of the invention are shown and described in conjunction with a heterostructure FET (HFET). However, it is understood that an HFET is only illustrative of various types of FET in conjunction with which embodiments can be utilized. The reduction in the $R_{ON}C_{IN}$ and $R_{ON}C_{OUT}$ products can be achieved by perforations located under the gate. The perforations can extend to perforate the channel under the gate, while leaving the source-gate and gate-drain regions of the channel continuous.

Aspects of the invention provide a device comprising a plurality of perforations to a semiconductor channel. The device includes a semiconductor structure forming the semiconductor channel. Additionally, the device includes a source contact, a drain contact, and a gate contact to the semiconductor channel. The plurality of perforations can be located in the semiconductor structure below the gate contact. Furthermore, a perforation in the plurality of perforations can extend into the semiconductor structure beyond a location of the semiconductor channel.

A first aspect of the invention provides a device comprising: a source contact; a drain contact; a semiconductor structure forming a semiconductor channel between the source and drain contacts; a gate contact to the semiconductor channel; and a plurality of perforations located in the semiconductor structure between the gate contact and the semiconductor channel, wherein a perforation in the plurality of perforations extends into the semiconductor structure beyond a location of the semiconductor channel.

A second aspect of the invention provides a circuit comprising: a field effect transistor including: a source contact; a drain contact; a semiconductor structure forming a semiconductor channel between the source and drain contacts; a gate contact to the semiconductor channel; and a plurality of perforations located in the semiconductor structure below the gate contact, wherein a perforation in the plurality of perforations extends into the semiconductor structure beyond a location of the semiconductor channel.

A third aspect of the invention provides a method of fabricating a device, the method comprising: obtaining a semiconductor structure configured to form a semiconductor channel between a source contact and a drain contact; and forming a plurality of perforations in the semiconductor structure in a region of the semiconductor structure corresponding to a gate contact, wherein a perforation in the plurality of perforations extends into the semiconductor structure beyond a location of the semiconductor channel.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 2A and 2B show typical equivalent circuits of a switching mode power amplifier and a power converter, respectively, according to embodiments, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device comprising a plurality of perforations to a semiconductor channel. The device includes a semiconductor structure forming the semiconductor channel. Additionally, the device includes a source contact, a drain contact, and a gate contact to the semiconductor channel. The plurality of perforations can be located in the semiconductor structure below the gate contact. Furthermore, a perforation in the plurality of perforations can extend into the semiconductor structure beyond a location of the semiconductor channel. A device having a design described herein can have one or more improved performance characteristics over devices of the prior art, including: an increase in a quality factor for a switching mode power amplifier; a decrease in source access resistance; a lower thermal impedance; a reduced peak field at the gate edge; and/or the like. A device configured as described herein can have a higher transconductance and a higher power amplifier gain than conventional devices. As used herein, unless otherwise noted, the term "set" means one or more (i.e., at least one) and the phrase "any solution" means any now known or later developed solution.

Figure 1A:
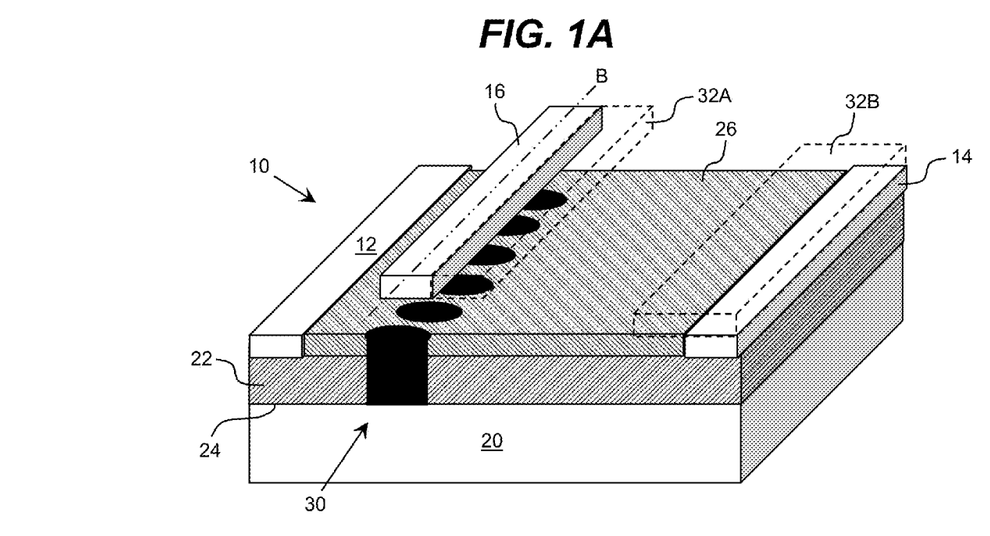
FIGS. 1A and 1B show perspective and cross-section views, respectively, of a device according to an embodiment.
Figure 1B:
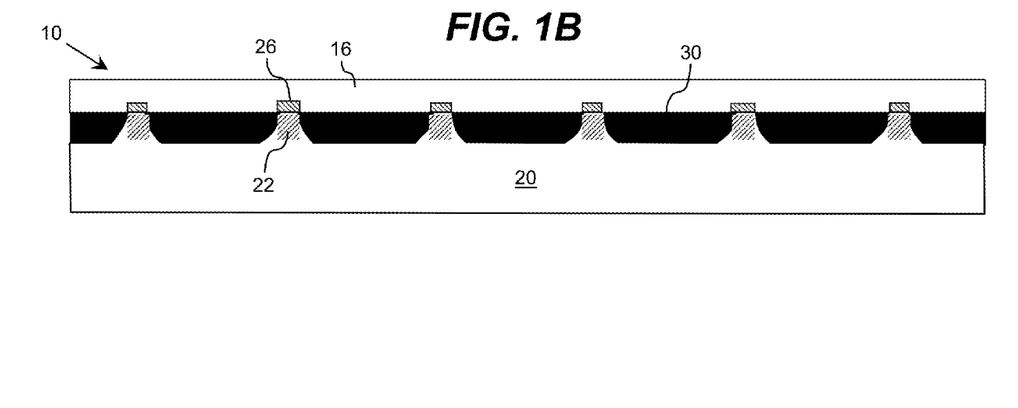

Aspects of the invention provide a device having a perforated-channel. In an illustrative embodiment, the device comprises a perforated-channel metal-insulator-semiconductor HFET (MISHFET). To this extent, FIGS. 1A and 1B show perspective and cross-section views, respectively, of a device 10 according to an embodiment. The cross-section of the device 10 shown in FIG. 1B corresponds to a cross-section of the device 10 along the line B shown in FIG. 1A.

As illustrated, the device 10 can be configured to be operated as a field effect transistor (FET). To this extent, the device 10 includes a source contact 12 and a drain contact 14 with a gate 16 located there between, each of which can be formed of, for example, any suitable metal. The gate 16 is shown raised in FIG. 1A to illustrate the structure of the device 10 located below the gate 16. The device 10 further includes a heterostructure including an active layer 20 and a barrier layer 22, each of which can be formed of a semiconductor material. A channel 24 is formed between the source contact 12 and drain contact 14 at the interface between the active layer 20 and the barrier layer 22.

In an embodiment, the active layer 20 and the barrier layer 22 are each formed of binary, ternary, or quaternary group III-V compounds. In a more particular embodiment, the group III-V compounds are group III nitrides. In a still more particular embodiment, the active layer 20 comprises GaN (e.g., i-type GaN), and the barrier layer 22 comprises AlGaN. However, it is understood that this is only illustrative of various possible semiconductor materials which can be used to form the channel 24. To this extent, a semiconductor described herein can be formed of any type of semiconductor material. Illustrative semiconductor materials include: silicon (Si), silicon carbide (SiC), germanium (Ge), SiGe, zinc oxide (ZnO), various types of group III-V or II-VI compound materials, and/or the like. Furthermore, the active layer 20 and/or barrier layer 22 can comprise one of: an amorphous, polycrystalline, microcrystalline, or nanoncrystalline semiconductor material (including, for example, Si, Ge, SiGe, and/or the like).

The device 10 can further include an insulating layer 26, which can be formed of any suitable type of insulating material, such as a dielectric. As illustrated, the insulating layer 26 can be located under the gate 16 and extend across the surface of the device 10 located between the source and drain contacts 12, 14. However, it is understood that inclusion of and the layout of the insulating layer 26 is only illustrative. To this extent, the device 10 can include other types and/or configurations of an insulating layer 26 or not include an insulating layer 26. In another embodiment, the insulating layer 26 can be located in one or both of the gate-drain and/or gate-source regions on a surface of the device 10.

Furthermore, in an embodiment, the insulating layer 26 can be formed of a layer of a low conducting material, which can help discharge a charge associated with the surface or bulk of the device 10 and thus reduce/eliminate unwanted dispersion and/or lag in the device 10 transient and/or high-frequency characteristics. The low conducting material can have a surface resistance that is significantly higher than that of metal electrodes, but is also much lower than that of a dielectric material. For example, the low conducting material can have a sheet resistance between approximately $10^3$ Ohm per square and approximately $10^7$ Ohm per square. Similarly, the low conducting material can have a surface conductivity that is significantly lower than that of metal electrodes, but is also much higher than that of a dielectric material. Illustrative low conducting materials include, for example: InGaN; a semiconductor; a low conducting dielectric single crystal; a textured, poly-crystalline or amorphous material; a semimetal material; oxides of nickel and other metals, and/or the like.

It is understood that device 10 is only illustrative of various configurations for FETs. To this extent, a device can include one or more additional layers/features utilized in the fabrication of devices, such as FETs. For example, an embodiment of the device 10 can include one or more field plates 32A, 32B, each of which can be formed from any suitable material, such as a metal.

The device 10 includes a plurality of perforations 30 located below the gate 16. A perforation 30 can be filled with any type of material having a low dielectric permittivity (e.g., low-k dielectric material). Illustrative low-k dielectric materials include, for example: fluorosilicate glass; silicon dioxide (e.g., carbon doped, porous, etc.); polymer materials (e.g., polyimide, benzocyclobutene (BCB), polytetrafluoroethylene (PTFE), etc.); spin-on dialectrics (e.g., hydrogen silsesquioxane (HSQ), methylsilsesquioxane (MSQ), etc.); polysilicon; and/or the like. In an embodiment, the low-k dielectric material has a dielectric constant at least ten percent smaller than a dielectric constant of the surrounding material (e.g., the materials of the active layer 20 and barrier layer 22). In a more particular embodiment, the low-k dielectric material has a dielectric constant at least two times smaller than the dielectric constant of the surrounding materials. In another embodiment, the gate 16 forms an air-bridge over the perforations 30, which are left at least partially unfilled.

The perforations 30 can have any of various dimensions as well as be placed in any of various arrangements. For example, a perforation 30 can have a depth that extends through the insulating layer 26 and at least partially through the barrier layer 22. In an embodiment, a perforation 30 can remove the semiconductor material in a portion of the device channel 24 as well as above and below the device channel 24. To this extent, a perforation 30 can extend through the barrier layer 22 and into a top portion of the active layer 20. In this case, the perforation 30 extends beyond the device channel 24. In another embodiment, a perforation 30 extends only partially through the barrier layer 22. In this case, the perforation 30 can extend through at least one third of a thickness of the barrier layer 22.

In an embodiment, a perforation 30 has a characteristic size (e.g., a largest lateral dimension) selected based on a distance between the drain contact 14 and the gate 16 and/or a distance between the source contact 14 and the gate 16. Furthermore, the characteristic size can be selected based on a target reduction of the gate-drain resistance and the corresponding dependencies described herein. In an illustrative embodiment, each perforation 30 has a characteristic size in a range between approximately equal to and approximately three times a characteristic size of an adjacent intact portion of the device channel 24. Similarly, adjacent perforations 30 can be separated by a distance selected based on a distance between the drain contact 14 and the gate 16 and/or a distance between the source contact 14 and the gate 16. In an embodiment, the perforations 30 are located in such a manner that the perforations 30 form a periodic structure located below the gate 16. In an embodiment, when a field plate 32A is included, one or more of the perforations 30 can be located under the field plate 32A. To this extent, a device 10 described herein can include perforations 30 located under the gate 16, the field plate 32A, or both. Furthermore, the device 10 can include one or more perforations 30 partially located under the gate 16 and the field plate 32A.

As discussed herein, the device 10 can be incorporated in a power switch or switching mode amplifier circuit. The following discussion addresses some of the design considerations for HFETs being utilized in this manner and some of the draw backs regarding use of typical GaN HFET designs and layouts.

Figure 2A:
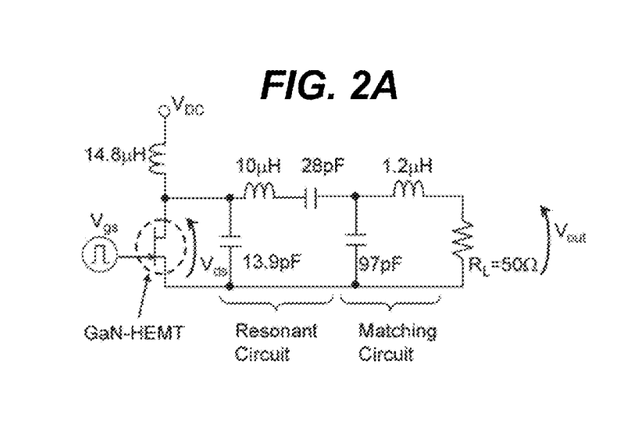
Figure 2B:
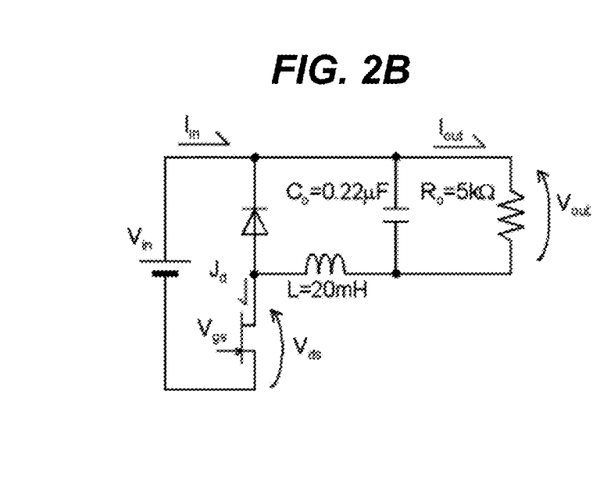
Figure 2C:
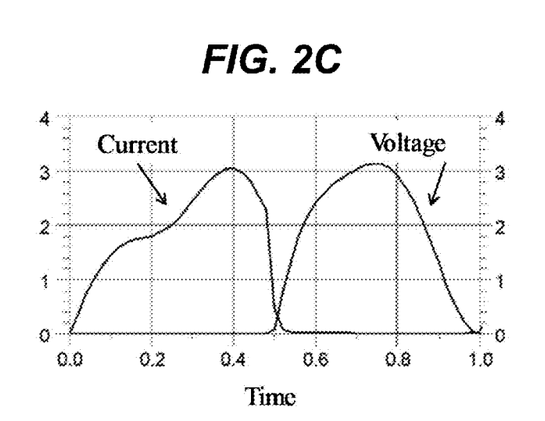
FIG. 2C shows typical voltage and current waveforms for a power converter and a power amplifier operating in switching mode.

FIGS. 2A and 2B show typical equivalent circuits of a switching mode power amplifier and a power converter, respectively, according to embodiments, while FIG. 2C shows typical voltage and current waveforms for a power converter or a class E/F switching mode power amplifier. An overlap of the current and voltage waveforms shown in FIG. 2C causes switching loss. Additionally, conduction loss is caused by a finite value of a device voltage, $V_{ON}$, in the on state, which is due to a finite on-resistance, $R_{ON}$, value. As a result, for high efficiency operation, the drain voltage in the on-state, $V_{ON}$, should be minimal. A finite $V_{ON}$ value is given by $I_{ON}*R_{ON}$, where $I_{ON}$ is the device current in the on-state. An approximate value of the conduction loss is given by the product $V_{ON} \times I_{ON}$. Furthermore, the drain current and drain voltage waveforms shown in FIG. 2C should have a minimal (close to zero) overlap. In power converters, an approximate value of the switching loss is given by the product $V_{MAX} \times C_{GD} \times f_{SW}$, where $f_{SW}$ is the converter switching frequency. In switching mode RF power amplifiers, the device output capacitance must not exceed a certain value to allow for the circuit to resonate at fundamental and higher harmonics. The condition for the maximum output capacitance can be expressed as:

$$f = 0.0506 \frac{P_{OUT}}{C_{OUT} V_{DD}^2}$$

At $P_{OUT}$=100 W, $V_{DD}$=300 V and f=1 GHz, the device output capacitance, $C_{OUT}$, must be less than $5.6 \times 10^{-14}$ F. Because a significant portion of the $C_{OUT}$ is related to the HFET gate-drain capacitance, $C_{GD}$, this requirement imposes a limit on a total width and channel length of the device.

On the other hand, the power amplifier efficiency, η, is limited by the HFET on-resistance, $R_{ON}$, according to the following formula:

$$\eta = 1 - 1.52 R_{ON}/R_L$$

Using an optimal value of the load resistance, $R_L$=591 Ohm for a given drain bias and output power, the on resistance should not exceed $R_{ON}$=39 Ohm for η=0.9, and $R_{ON}$=19.5 Ohm for η=0.95.

As described herein, the HFET quality factor for power conversion and switching mode power amplifier applications can be expressed as $\omega_{SW}=(R_{ON} C_{OUT})^{-1}$, which can be maximized to achieve the highest η values. In most FET device types, the $C_{GD}$ capacitance constitutes a significant portion of the $C_{OUT}$. Furthermore, other components of the output capacitance, such as field-plate capacitances, are proportional to the $C_{GS}$ and $C_{GD}$ capacitances, and hence reduce as well in a device including perforations described herein as compared to a device having a conventional design.

The trade-off between $C_{OUT}$ and $R_{ON}$ presents a significant challenge in the design of HFETs for use in power switches and amplifiers. The $R_{ON}$ value can be decreased by reducing gate-drain spacing of the HFET. However, this spacing is limited by the device breakdown. Current state-of-the-art GaN HFETs can achieve 1000 V breakdown voltage at typical gate-drain spacing values of $L_{GD} \approx 10$ μm. Therefore, decreasing the gate-drain spacing below 10 μm is not feasible to obtain the required power switch or amplifier characteristics.

Further discussion of the analysis is now included for completeness of the disclosure. However, it is understood that the invention is not limited to this analysis. Required and achievable values of HFET on-resistance, $R_{ON}$, and output capacitance, $C_{OUT}$, are estimated and compared for a switching mode power amplifier at an operating frequency, f, of one gigahertz and different power amplifier efficiency levels, η. The illustrative power amplifier has an output power, $P_{OUT}$, of 100 Watts; a drain bias, $V_{DD}$, of 300 Volts; and a drain RF peak voltage, $V_{DM}$, of 1000 Volts.

The $R_{ON}$ value depends on the HFET total channel width, and can be found using the following equation:

$$R_{on} = 2R_{C1}/W + R_{sh}*L_{DS}/W,$$

where $R_{C1}$ is the unit-width contact resistance, W is the channel width, $R_{sh}$ is the epilayer sheet resistance, and $L_{DS}$ is the source-drain distance, which can be found by summing the source-gate distance ($L_{SG}$), gate length ($L_G$), and gate-drain distance ($L_{GD}$). For these estimates, $R_{C1}$=0.5 Ohm×mm can be used. Power switches and power amplifiers with $L_G$<1 μm may not be suitable due to a rapid increase in the drain-source capacitance caused by two-dimensional electron gas channel coupling between the source and drain sides of the gate. As a result, $L_G=L_{SG}=1$ µm can be used in the estimates. Furthermore, $L_{GD}=10$ µm can be used to accommodate a device peak voltage $V_{DM}=1000$ V. For the epilayer sheet resistance, $R_{sh}=300$ Ohm can be used as an estimate, which is typically obtained in current GaN HFET technology.

Figure 3:
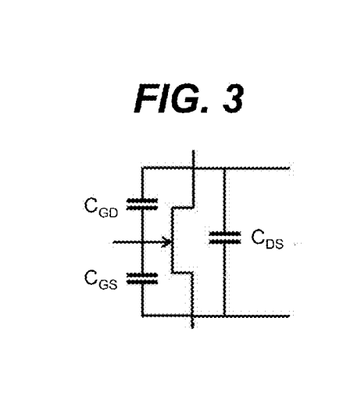
FIG. 3 shows input and output capacitances of a field effect transistor.

FIG. 3 shows input and output capacitances of a field effect transistor. Using this equivalent circuit, an average out capacitance, $C_{OUT}$, of the HFET operating as a switching mode power amplifier can be found. During a half period when the drain voltage is low and drain current is high, the values for the gate-drain capacitance, $C_{GD}$, and the gate-source capacitance, $C_{GS}$, correspond to approximately half of the gate-channel capacitance, $C_{CH}$, and can be found by the expression:

$$C_{GD} = C_{GS} = \frac{C_{CH}}{2}, \text{ where } C_{CH} = \frac{\varepsilon \varepsilon_0 L_G W}{d_{BAR}}$$

During the next half-period, $C_{GS}$ remains approximately the same whereas $C_{GD}$ reduces approximately down to zero. With respect to the drain and source terminals, $C_{GS}$ and $C_{GD}$ are connected in series. Therefore, an average capacitance over the period of RF oscillations, $C_{GD,GS\_AV}$, is related to $C_{GD}$ and $C_{GS}$ is given by $C_{GD,GS\_AV}=C_{CH}/8$. For values of $L_G=0.5$ µm and $d_{BAR}=20$ nm, $C_{CH}=2$ pF/mm and $C_{GD,GS\_AV}=0.25$ pF/mm. In parallel with $C_{GD}, C_{GS}$, the drain-source capacitance, $C_{DS}$, is connected and is typically in the range of 0.2-0.3 pF/mm. Using a value of $C_{DS}=0.25$ pF/mm, the values for $C_{OUT}=C_{GD,GS\_AV}+C_{DS}\approx0.5$ pF/mm are obtained. The above capacitance values are described herein for illustrative purpose only. To this extent, it is understood that the capacitance values can differ for different device geometries and designs.

While not bound to any particular theory, the inventors propose to use the device 10 (FIGS. 1A and 1B) as a transistor switch in power converter and amplifier circuits, such as those shown in FIGS. 2A and 2B.

For example, the analysis presented herein indicates that the device 10 can obtain $R_{ON}$ resistances three to five times lower than conventional HFET designs for a given value of the active channel width and hence the corresponding output capacitance, $C_{OUT}$. In the device 10, the $C_{OUT}$ limitation is achieved by removing portions of the channel 24 using the perforations 30. Low $R_{ON}$ values are achieved using current spreading in the source-gate and gate-drain regions of the device 10.

Figure 4A:
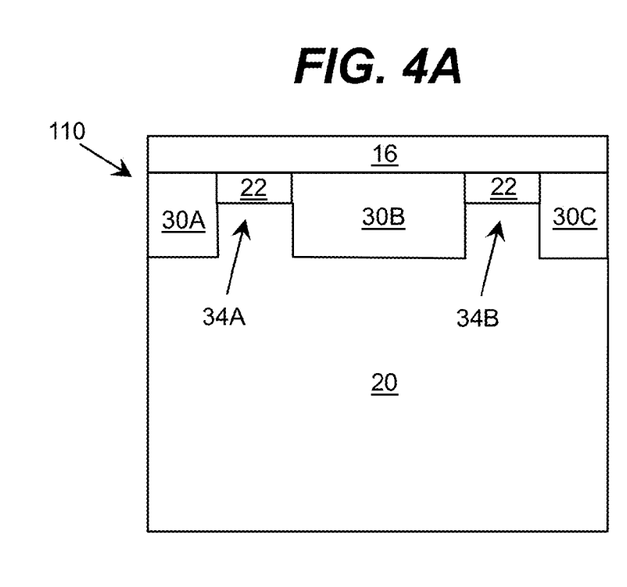
FIGS. 4A and 4B show cross section and top views, respectively, of an illustrative device according to an embodiment.
Figure 4B:
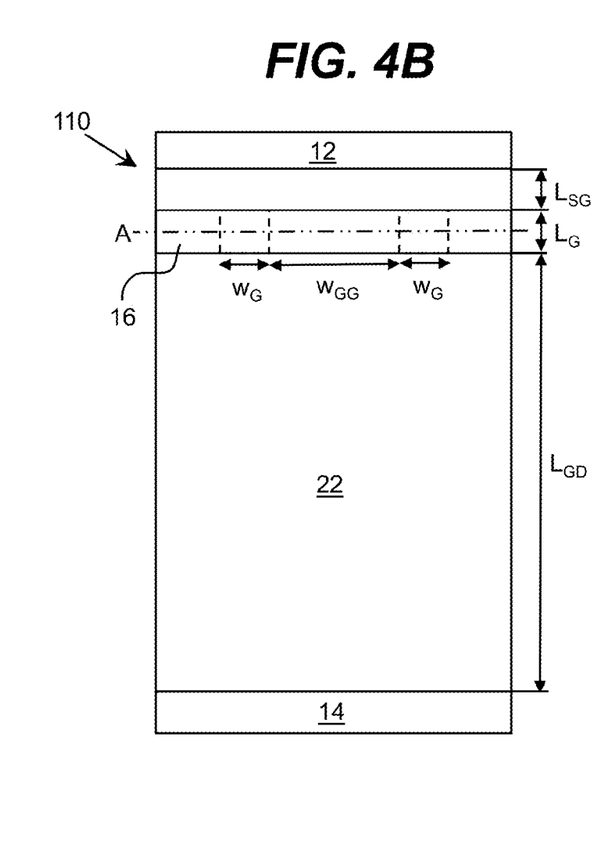

FIGS. 4A and 4B show cross section and top views, respectively, of an illustrative device 110 according to an embodiment. The cross-section of the device 110 shown in FIG. 4A corresponds to a cross-section of the device 110 along the line A shown in FIG. 4B. As illustrated, a plurality of perforations 30A-30C are located under the gate 16 and are separated by portions of the channel for the device 110 that remain, thereby forming channel islands 34A, 34B under the gate 16. Current density distribution was simulated for the device 110 using a 2D Synopsys Sentaurus Device Simulator. In these simulations, the source-gate distance, $L_{SG}$, is 1 µm, the gate length, $L_G$, is 1 µm and the gate-drain spacing, $L_{GD}$, is 10 µm. The sheet resistance of the two dimensional electron gas layer was 300 Ohm.

Different values for a width of each channel island, $W_G$, and a channel island-to-channel island spacing $W_{GG}$, were used in the simulations.

Figure 5A:
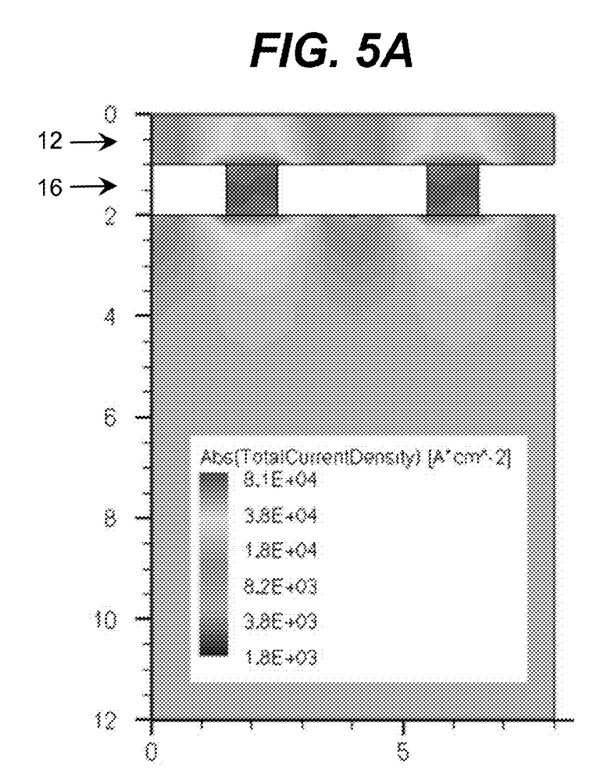
FIGS. 5A and 5B show simulated current density and potential distributions, respectively, for the device shown in FIGS. 4A and 4B.
Figure 5B:
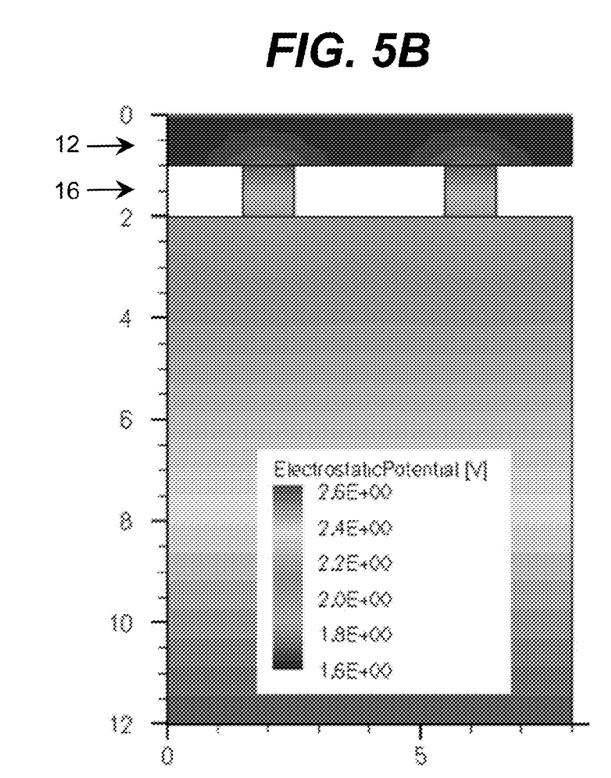

FIGS. 5A and 5B show simulated current density and potential distributions, respectively, for the device 110 (FIGS. 4A and 4B), each of which corresponds to the top view of the device 110 shown in FIG. 4B. In this simulation, the width of each channel island, $W_G$, is 1 µm, and the channel island-to-channel island spacing, $W_{GG}$, is 3 µm. The simulation indicates a reduction in drain access resistance for the device 110 as compared to conventional designs. Very efficient current spreading in the gate-drain region is clearly observed from the simulations. Using the simulated device current-voltages and the potential distribution in the gate-drain region, the gate-drain resistance per single channel was found to be $R_{GD}=580$ Ohm. In the absence of current spreading, this resistance would correspond to a 1 µm wide and 10 µm long bar yielding $R_{GD\_CH}=3000$ Ohm. As a result, a reduction factor of the drain access resistance is approximately 0.19, or over five times lower than a conventional device with the same width of the active channel.

Significant current spreading also can take place in the source-gate spacing. For a device 110 with $L_{SG}=1$ µm, the source resistance reduction coefficient was found to be 0.54, e.g., the equivalent source resistance is around two times smaller than in a conventional HFET. Lower source resistance further decreases $R_{ON}$ and also can lead to higher transconductance, higher gain, and a higher power-added efficiency (PAE) of a corresponding radio frequency power amplifier.

Figure 6A:
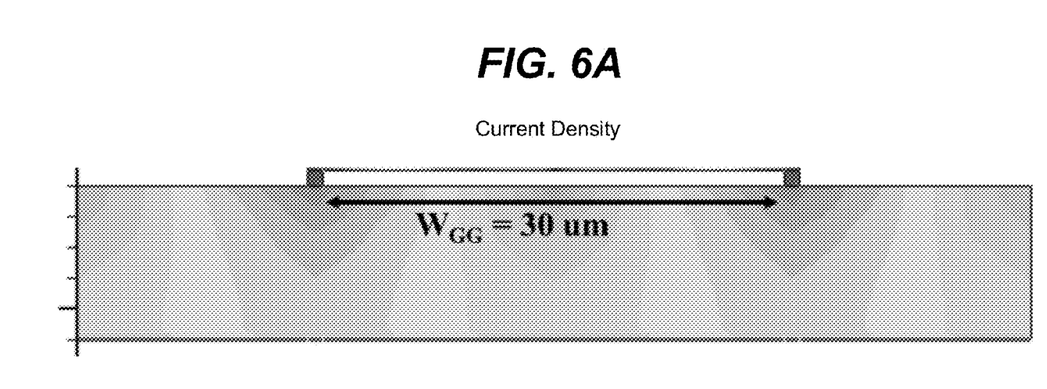
FIGS. 6A and 6B show current density and potential distributions, respectively, for the device shown in FIGS. 4A and 4B.
Figure 6B:
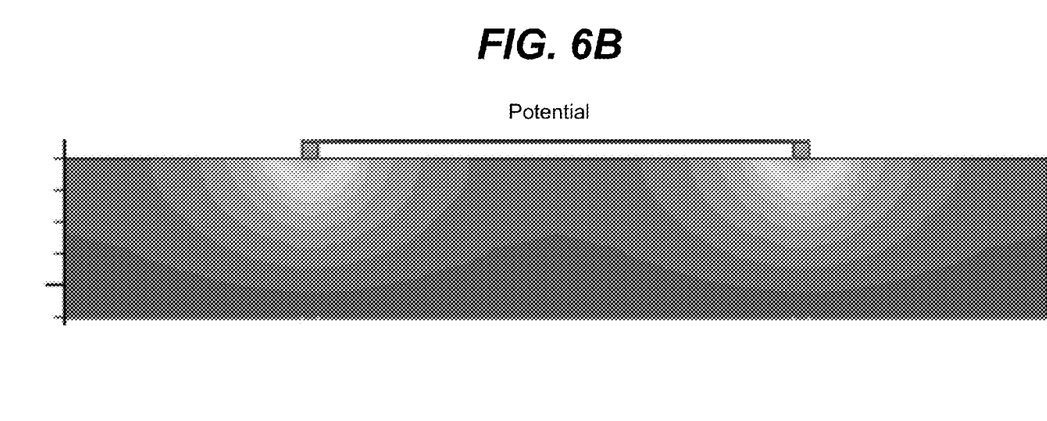

Further simulations indicate a strong current spreading effect takes place even when the channel island-to-channel island spacing, $W_{GG}$, exceeds the gate-drain and/or gate-source distances. This is illustrated by the current density and potential distributions shown in FIGS. 6A and 6B. In this simulation, the channel island-to-channel island spacing, $W_{GG}=30$ µm, or three times the gate-drain spacing, which is 10 µm. As illustrated, strongly non-uniform current and potential distributions at the drain edge of the gate significantly smoothen out towards the drain electrode. The $R_{GD}$ reduction factor for this geometry is 0.11, i.e., the resistance decreases approximately ten times compared to a device having no-spreading layout.

Figure 7A:
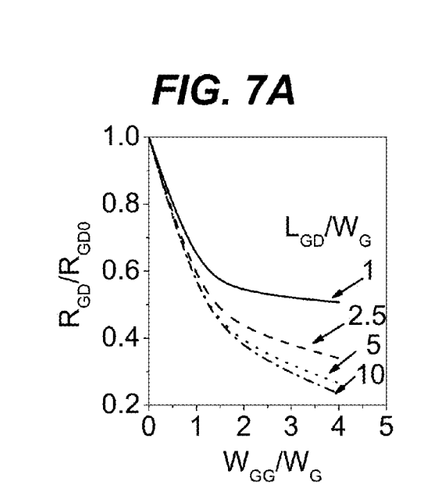
FIGS. 7A-7D show various dependencies of HFET attributes on various device configurations described herein according to embodiments.
Figure 7B:
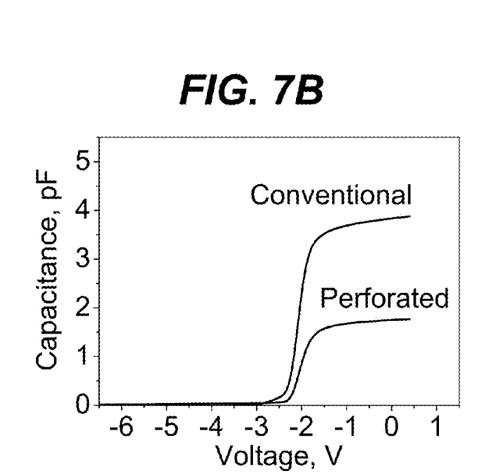
Figure 7C:
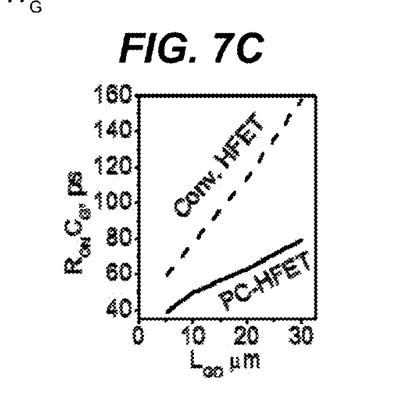
Figure 7D:
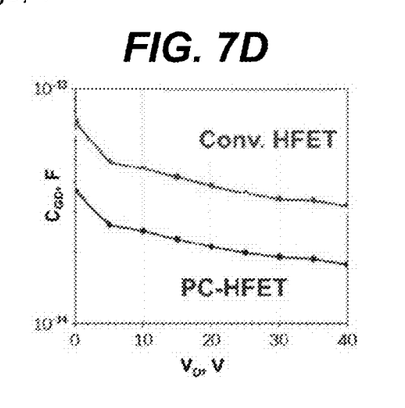

FIGS. 7A-7D show various dependencies of HFET attributes on various device configurations described herein according to embodiments. Furthermore, FIGS. 7B-7D show comparable dependencies for conventional HFETs. In particular, FIG. 7A shows the dependence of the gate-drain resistance, $R_{GD}$, of a perforated channel HFET described herein on a perforation factor equal to a channel opening/island ratio, $W_{GG}/W_G$. In FIG. 7A, the $R_{GD}$ values are normalized to a gate-drain resistance of the device in the absence of current spreading in the gate-drain region. FIG. 7B shows the gate capacitance-voltage dependencies for perforated and conventional devices of the same total width.

FIG. 7C shows an $R_{ON}C_G$ product dependence for perforated (PC-HFET) and conventional devices on the gate-drain distance according to an embodiment. In FIG. 7C, the PC-HFET has an illustrative perforation factor $W_{GG}/W_G=1.3$. As illustrated, a two-fold improvement in the HFET quality factor $1/(R_{ON}C_G)$ can be achieved using the perforated channel technology described herein. With larger values of $W_{GG}/W_G$, the improvement can be correspondingly larger as evidenced by the dependencies shown in FIG. 7A. FIG. 7D shows the gate-drain capacitance, $C_{GD}$, –drain voltage, $V_D$, dependence for perforated and conventional devices according to an embodiment. The $C_{GD}$ value is an important parameter contributing to switching loss in power switches and power amplifiers.

Strong current spreading in the gate-drain region of a device described herein may allow for other benefits. For example, an embodiment of the device can be fabricated with a field plate (such as one or both field plates 32A, 32B shown in FIG. 1A) placed beyond the gate edge in the gate-drain region. Inclusion of the field-plate(s) 32A, 32B can produce a more efficient reduction of the peak field than that of a conventional HFET. This is expected because the field plate(s) 32A, 32B will also reduce the electric field at the side edges of the gate, thus pushing the electric field into the gate-drain region not only along the channel, but also sidewise. Heat removal in a device described herein also should be significantly more efficient as compared to a conventional device because of the quazi-3D character of the thermal flux.

Figure 8:
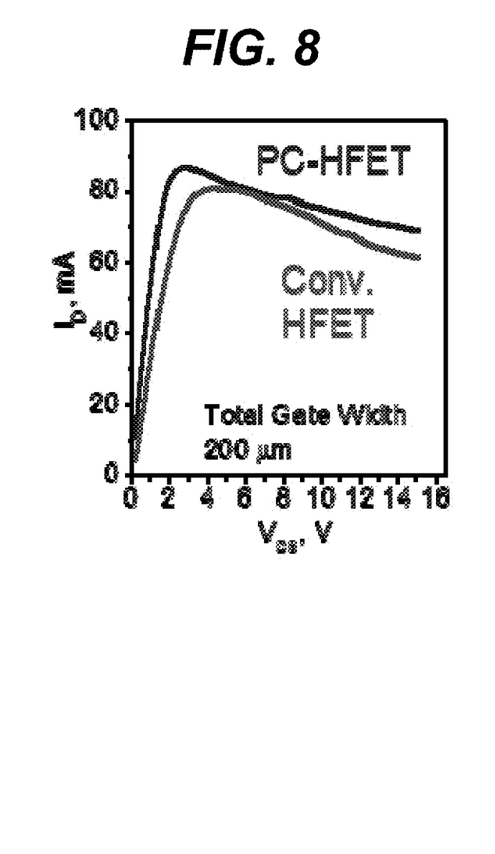
FIG. 8 shows drain-current voltage characteristics of a device described herein in comparison with a conventional device having the same total gate width according to an embodiment.

FIG. 8 shows drain current-voltage characteristics of a device described herein in comparison with a conventional device having the same total gate width according to an embodiment. As evidenced by the slope of the linear portion of the current-voltage characteristics, the device having a perforated channel as described herein (PC-HFET) exhibits a lower on-resistance than that of a conventional device. Furthermore, as evidenced by a higher peak current and a smaller roll-off of the current-voltage characteristics in the current saturation region, the device having a perforated channel as described herein also exhibits a lower thermal resistance than that of a conventional device.

Figure 9:
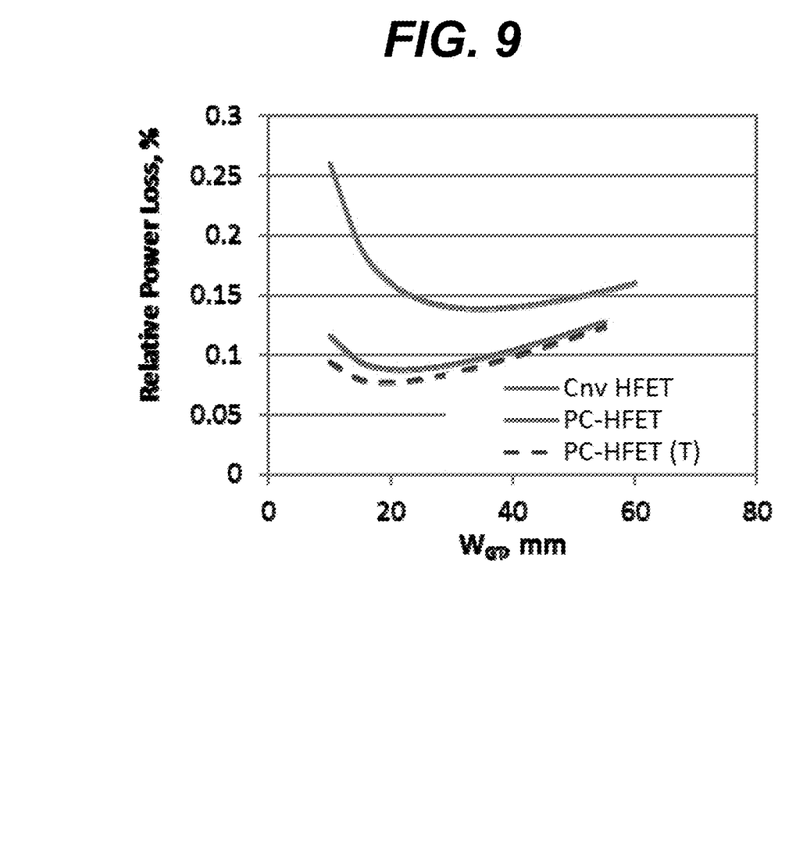
FIG. 9 shows relative power losses of a device described herein in comparison with a conventional device as a function of total gate width according to an embodiment.

FIG. 9 shows relative power loss, including conductance and switching losses, of a device described herein (PC-HFET) in comparison with a conventional device as a function of total gate width, $W_{GT}$, according to an embodiment. The losses are normalized to the corresponding device maximum powers. Typical GaN-based device parameters have been used for both device types. As an illustration, an output capacitance $C_{OUT}=0.02\times C_G$, a maximum current of ten amperes and a maximum voltage of one kilovolt were used in calculations. The parameters for the PC-HFET are calculated for a perforation factor $W_{GG}/W_G=3$. The dash line (PC-HFET (T)) shows the power loss of the perforated channel device accounting for a reduced thermal resistance due to the channel perforation. As illustrated, an HFET including perforations below the gate as described herein (PC-HFET) has a significant reduction in total loss as compared with a conventional HFET (Cnv HFET), which has a continuous channel. For example, channel perforation described herein also can reduce a thermal resistance between the channel and the substrate or cap materials of the device, e.g., by increasing an effective area for heat removal. In particular, FIG. 9 illustrates a reduction in the self-heating effects in a device described herein as compared to conventional device with the same peak current. Estimations based on FIG. 9 suggest that the thermal resistance in a device described herein can decrease by approximately twenty to thirty percent.

It is understood that aspects of the invention can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like.

Furthermore, it is understood that a device described herein can be fabricated using any solution. For example, referring to FIGS. 1A and 1B, a heterostructure including layers 20, 22, and 26 can be formed using any solution, e.g., growth of the layers. The perforations 30 can be formed using, for example, optical lithography in combination with well established etching and deposition techniques. The contacts 12, 14, gate 16, field plates 32A, 32B, and/or the like, also can be formed using any solution.

Figure 10:
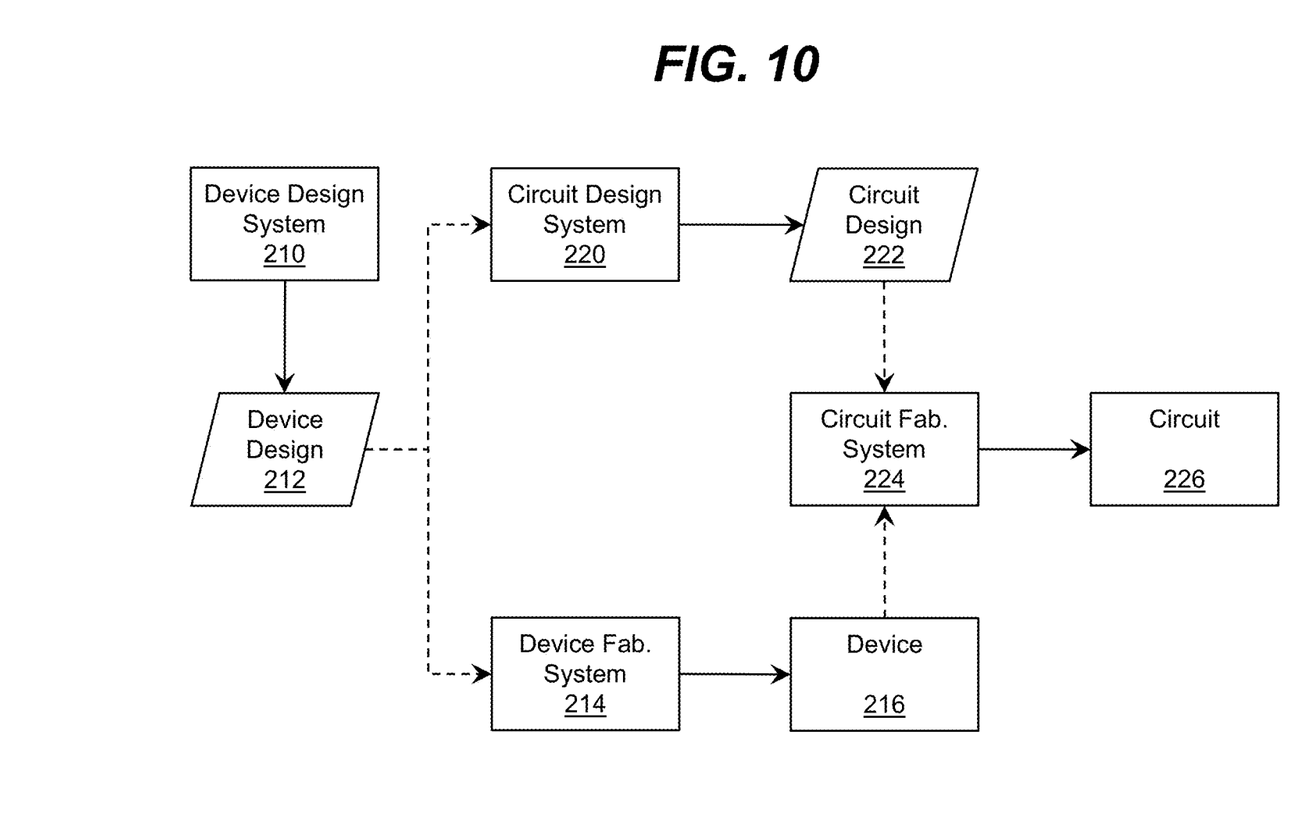
FIG. 10 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 10 shows an illustrative flow diagram for fabricating a circuit 226 according to an embodiment. Initially, a user can utilize a device design system 210 to generate a device design 212 for a semiconductor device as described herein. The device design 212 can comprise program code, which can be used by a device fabrication system 214 to generate a set of physical devices 216 according to the features defined by the device design 212. Similarly, the device design 212 can be provided to a circuit design system 220 (e.g., as an available component for use in circuits), which a user can utilize to generate a circuit design 222 (e.g., by connecting one or more inputs and outputs to various devices included in a circuit). The circuit design 222 can comprise program code that includes a device designed as described herein. In any event, the circuit design 222 and/or one or more physical devices 216 can be provided to a circuit fabrication system 224, which can generate a physical circuit 226 according to the circuit design 222. The physical circuit 226 can include one or more devices 216 designed as described herein.

In another embodiment, the invention provides a device design system 210 for designing and/or a device fabrication system 214 for fabricating a semiconductor device 216 as described herein. In this case, the system 210, 214 can comprise a general purpose computing device, which is programmed to implement a method of designing and/or fabricating the semiconductor device 216 as described herein. Similarly, an embodiment of the invention provides a circuit design system 220 for designing and/or a circuit fabrication system 224 for fabricating a circuit 226 that includes at least one device 216 designed and/or fabricated as described herein. In this case, the system 220, 224 can comprise a general purpose computing device, which is programmed to implement a method of designing and/or fabricating the circuit 226 including at least one semiconductor device 216 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 210 to generate the device design 212 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 210 for designing and/or a device fabrication system 214 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
a source contact;
a drain contact;
a semiconductor structure forming a semiconductor channel between the source and drain contacts;
a gate contact to the semiconductor channel; and
a plurality of perforations located in the semiconductor structure between the gate contact and the semiconductor channel, wherein a perforation in the plurality of perforations extends into the semiconductor structure beyond a location of the semiconductor channel, and wherein the gate contact forms an air bridge over a perforation in the plurality of perforations.

2. The device of claim 1, wherein a perforation in the plurality of perforations is at least partially filled with a material having a low dielectric permittivity relative to silicon dioxide.

3. The device of claim 1, wherein the plurality of perforations form a periodic structure.

4. The device of claim 1, wherein the plurality of perforations form a plurality of channel islands located below the gate, and wherein adjacent channel islands are separated by a distance approximately equal to or up to ten times a characteristic size of the perforations.

5. The device of claim 1, further comprising a gate insulating layer located between the gate contact and the semiconductor structure, wherein the plurality of perforations extend through the gate insulating layer.

6. The device of claim 1, further comprising a low conducting layer located on at least a portion of a surface of the semiconductor structure between the source and drain contacts.

7. The device of claim 1, further comprising at least one field plate, wherein each of the at least one field plate is attached to one of: the gate contact or the drain contact.

8. The device of claim 1, further comprising:
a field plate extending from a drain side of the gate contact into a spacing between the gate contact and the drain contact; and
a plurality of perforations located in the semiconductor structure between the field plate and the semiconductor channel.

9. A circuit comprising:
a field effect transistor including:
a source contact;
a drain contact;
a semiconductor structure forming a semiconductor channel between the source and drain contacts;
a gate contact to the semiconductor channel; and
a plurality of perforations located in the semiconductor structure below the gate contact, wherein a perforation in the plurality of perforations extends into the semiconductor structure beyond a location of the semiconductor channel, and
wherein the gate contact forms an air bridge over a perforation in the plurality of perforations.

10. The circuit of claim 9, wherein the circuit comprises a power amplifier including the field effect transistor.

11. The circuit of claim 10, wherein the field effect transistor is configured to be operated in a class E/F switching mode in the circuit.

12. The circuit of claim 9, wherein the circuit comprises a power converter circuit including the field effect transistor.

13. The circuit of claim 9, wherein a perforation in the plurality of perforations is at least partially filled with a material having a low dielectric permittivity relative to silicon dioxide.

14. The circuit of claim 9, wherein the plurality of perforations form a plurality of channel islands located below the gate, and wherein adjacent channel islands are separated by a distance approximately equal to or up to ten times a characteristic size of the perforations.

15. The circuit of claim 9, wherein the field effect transistor further includes:
a field plate extending from a drain side of the gate contact into a spacing between the gate contact and the drain contact; and
a plurality of perforations located in the semiconductor structure between the field plate and the semiconductor channel.

16. A device comprising:
a source contact;
a drain contact;
a semiconductor structure forming a semiconductor channel between the source and drain contacts;
a gate contact to the semiconductor channel;
a first plurality of perforations located in the semiconductor structure between the gate contact and the semiconductor channel, wherein a perforation in the first plurality of perforations extends into the semiconductor structure beyond a location of the semiconductor channel;

a field plate extending from a drain side of the gate contact into a spacing between the gate contact and the drain contact; and a second plurality of perforations located in the semiconductor structure between the field plate and the semiconductor channel.

17. The device of claim 16, wherein a perforation in the first plurality of perforations is at least partially filled with a material having a low dielectric permittivity relative to silicon dioxide.

18. The device of claim 16, wherein the first plurality of perforations form a periodic structure.

19. The device of claim 16, wherein the plurality of perforations form a plurality of channel islands located below the gate, and wherein adjacent channel islands are separated by a distance approximately equal to or up to ten times a characteristic size of the perforations.

20. The device of claim 16, further comprising a low conducting layer located on at least a portion of a surface of the semiconductor structure between the source and drain contacts.

* * * * *